US010601370B2

(12) United States Patent
Parrott et al.

(10) Patent No.: US 10,601,370 B2
(45) Date of Patent: Mar. 24, 2020

(54) FERRITE RESONATORS USING MAGNETIC BIASING AND SPIN PRECESSION

(71) Applicants: VIDA IP, LLC, Rohnert Park, CA (US); Ronald A. Parrott, Healdsburg, CA (US); Allen A. Sweet, Alameda, CA (US)

(72) Inventors: Ronald A. Parrott, Healdsburg, CA (US); Allen A. Sweet, Alameda, CA (US)

(73) Assignee: Vida Products, Rohnert Park, CA (US)

( * ) Notice: Subject to any disclaimer, the term of this patent is extended or adjusted under 35 U.S.C. 154(b) by 238 days.

(21) Appl. No.: 15/536,413

(22) PCT Filed: Dec. 17, 2015

(86) PCT No.: PCT/US2015/066461
§ 371 (c)(1),
(2) Date: Jun. 15, 2017

(87) PCT Pub. No.: WO2016/100713
PCT Pub. Date: Jun. 23, 2016

(65) Prior Publication Data
US 2018/0006603 A1 Jan. 4, 2018

Related U.S. Application Data

(60) Provisional application No. 62/093,395, filed on Dec. 17, 2014.

(51) Int. Cl.
*H03B 5/18* (2006.01)
*H03B 9/14* (2006.01)
*H01P 1/218* (2006.01)
*H01P 7/08* (2006.01)

(52) U.S. Cl.
CPC ........... *H03B 5/1882* (2013.01); *H01P 1/218* (2013.01); *H01P 7/08* (2013.01); *H03B 9/142* (2013.01); *H03B 2200/009* (2013.01)

(58) Field of Classification Search
CPC ... H01P 1/218; H01P 1/19; H01P 7/08; H03B 5/18; H03B 5/1882; H03B 9/142; H03B 2200/009
USPC ...... 333/202, 219, 219.2, 99 S, 235; 331/96, 331/117 D, 177 R, 77; 505/866, 210
See application file for complete search history.

(56) References Cited

U.S. PATENT DOCUMENTS

| 3,016,495 A | 1/1962 | Tien |
| 3,611,197 A | 10/1971 | Moore |
| 3,909,746 A | 9/1975 | Abraham |
| 4,704,739 A | 11/1987 | Murakami et al. |
| 4,887,052 A | 12/1989 | Murakami et al. |
| 5,418,507 A * | 5/1995 | Keane .................... H01P 1/218 333/202 |
| 5,424,698 A | 6/1995 | Dydyk |
| 5,465,417 A * | 11/1995 | Tanbakuchi ......... H03D 7/1408 333/235 |

(Continued)

*Primary Examiner* — Arnold M Kinkead
(74) *Attorney, Agent, or Firm* — Craig M. Stainbrook; Stainbrook & Stainbrook, LLP

(57) ABSTRACT

A low loss unidirectional conductive sheet using magnetic field biasing and electron spin precession for coupling RF power to ferrite resonators, comprising the step of placing a plurality of ferrite resonators in a bias magnetic field to excite the electron spins of the materials of said ferrite resonators into precession.

8 Claims, 4 Drawing Sheets

(56) References Cited

U.S. PATENT DOCUMENTS 7,528,688 B2 *   5/2009   Srinivasan ................ H01P 1/19
                                                  333/202
2010/0259108 A1  10/2010  Giler et al.

* cited by examiner

FERRITE RESONATORS USING MAGNETIC BIASING AND SPIN PRECESSION

BACKGROUND OF THE INVENTION

Technical Field

The present invention relates generally to resonators for electrical circuits, and more particularly to tunable resonators, and still more particularly to an extremely low loss unidirectional conductive sheet that couples microwave through and beyond millimeter-wave frequencies for use as nearly perfect resonators that are both tunable and configurable into a variety of RF and digital circuit functions.

Background Art

A fundamental problem with electronic circuits and components, including integrated circuits, is Johnson noise (Johnson-Nyquist or thermal noise) due to electric charge thermal movement. Most of the equations that define circuit laws presently use the laws relating to voltage and current for power and information transfer. As the state of the art in realizing more physically fundamental components has increased, there is an opportunity to use the magnetic field laws for circuits and functions. It is the objective of this invention to enable that new approach to circuit design. This invention will exploit the physics associated with time-varying voltage and currents, and primarily the magnetic fields associated with electron spin.

As the demand for ever smaller components and circuits intensified, to satisfy communications and computers requirements, the fundamental performance of key specifications were relaxed and the functions obtained through software and the "brute force" methods of more units and power were employed to accomplish the goals. This results in inefficient power consumption in order to balance informational robustness with a lack of signal quality.

Before the widespread use of microwaves, much of the microwave and higher frequency was implemented as physical hardware, and resonators and waveguides were cavities similar to acoustical design for generating and guiding waves traveling at the speed of light rather than the speed of sound. The microwave hardware was designed with Maxwell's laws and very quickly utilized time-varying voltages, currents, phase, and power flow. Mathematics was already in place for many designs, and functions existed to model the components that generated RF power and to derive information for radio and radar systems. Equipment was very costly and very large—the size being tied to the 11.81 inch wavelength in air at 1 GHz—and generally limited to a narrow range of frequency tuning.

To overcome these limitations, planar circuits were developed using planewave structures such as striplines, microstrip, and other structural configurations for electrical transmission lines. This led to semiconductors, hybrid integrated circuits, and finally to monolithic integrated circuits. The planewave structures were a natural extension of printed wiring boards that replaced wire components and led through the same path to monolithic integrated circuits for DC to GHz and digital components. These developments and an explosion in applications, computers, and software established a multitude of semiconductor foundries making the devices that define our world.

A lingering problem is that the limited resources of power and informational bandwidth are consumed with only a small percent of the people and businesses able to benefit. There is a longstanding need for performance many times the currently available performance capability.

The early devices made with full use of the physical laws were theoretically efficient and performed within their limitations, but they could not be widely implemented. Current devices have reached performance limits because of fundamental limitations in the ability of electromagnetic waves to carry information, as described by the Shannon-Hartley theorem, but they can be deployed widely due to manufacturing efficiency. To overcome the limitations in performance, tremendous effort is now directed to developing a new technology, some based on nanoscale materials. It is hoped that radical miniaturization will achieve not only size reduction, but will also allow performance to return to a physical maximum. Laboratories are synthesizing new molecules and even controlling the quantum behavior of particles. Much of that work utilizes devices that employ the magnetic properties of matter, especially in the application of carriers using light frequencies.

Disclosure of Invention

The present invention is an extremely low loss unidirectional conductive sheet for coupling RF power to ferrite resonators. The inventive device has extremely low loss by exploiting magnetic field biasing and electron spin precession. In its most essential aspect, the approach is to place ferrite resonators in a magnetic bias field to excite the electron spins of the materials into precession. The precession mechanism is lossless and will continue until the magnetic field is removed. The invention also provides a method of coupling energy to electrons and transferring the power to outside uses. The method is by its nature compatible with existing technology used in monolithic microwave integrated circuits with macro sizes. As its size decreases, its performance increases, because it is fabricated from nano materials, and performance at smaller scales improves under the inverse square law over distance.

As electronic circuits become smaller, moving into the nano-dimensional realm, quantum behavior begins to dominate electron movement. The usual result is an increase in noise. The present invention exploits an electron spin precession resonance in response to a static bias magnetic field that generates a precessional rotational cycle linearly proportional to the applied magnetic field. A time-varying electromagnetic field will interact with an electron precession due to magnetic coupling, if the time-varying magnetic vector is orthogonal to the magnetic bias field and has the same frequency as the precession. One way to describe this interaction is by a tensor of permeability, P. This tensor is composed of a body or group of electrons that are both magnetically coupled and spin coupled. This is currently realized by crystals of ferrites, usually Yttrium Iron Garnet or YIG. Other materials can also be used.

In the absence of an external RF field at the frequency of the precessional rate, the electrons precess without any energy loss and will continue to precess as long as the bias magnetic field is present. If the magnetic field is increased or decreased, then the frequency of the precession will change proportional to the changes in magnetic bias field intensity. As previously noted, a time-varying magnetic field (TVMF) will interact with the electron if it is at the precessional frequency, and may be modeled as change in the permeability tensor at that frequency. The result is that energy will be transferred to and from the TVMF, and if there is no loss in conductors generating the field, then the TVMF will continue undiminished until it is lost through radiation.

To make use of this phenomenon it is necessary to introduce and to translate the energy from TVMF to an application. Prior art includes such use through current loops, transmission lines, and wave guide systems to couple TVMF generated by electron current flow to a resonator comprising a YIG crystal in a biasing magnetic field. In practice, the TVMF is at microwave frequencies (RF) for YIG resonators, and a resonator is utilized to make filters, limit power, and control oscillation. The resonator loss is contained in the stored-to-dissipated energy relationship, or Q, according to the following relationship: $Q=2\pi \times Es/Ed$, where Es=Energy Stored and Ed=Energy Dissipated per cycle.

The loss in the spin precession of an electron immersed in a magnetic field must be zero, or the precession decays over time, and that has not been observed. Then all the observable loss must be a result of the coupling mechanization. A problem with observation is that the act of individual observation has effect on the spin-state, due to the quantum nature of the electron spin. The act of observation is related to both the applied power and the observed Q of the resonator. For electronic resonators composed of electronic devices, such as capacitors, inductors, and resistors, the Q is determined by the total equivalent resistance, including any loss in the capacitor or inductor and the loss incurred by the resistor. The loss is generally measured by the response of the circuit over a frequency range, thus: $Q=f_r/\Delta$, where $f_r$, is the frequency at the resonance center frequency and $\Delta$ is the frequency range of the ½ power point.

The losses of YIG and other ferrite materials have been measured for over a half century and are typically measured in linewidth, which has magnetic units of oersted (Oe). The linewidth is defined identically as $\Delta_f$ of the resonance in magnetic units proportional to frequency at $f_0$. It is observed that this would mean that the Q would go up with increasing frequency. The effect has been noted at frequencies below approximately 10 GHz, but testing at higher frequencies has shown that the Q stays the same or diminishes. Test data show resonator Q improvement up to 20 GHz, which motivated further investigation and research by the present inventors.

The reason for Q reduction with frequency may be related to the TVMF distortion, which is associated with the coupling mechanism and worsens as the frequency increases. All magnetic currents couple to the YIG resonator, and any fields are superimposed. This results in both the bias and RF fields varying in phase and magnitude. It can be shown that this degrades the losses comparable to losses from material defects. In any event, the Q of existing YIG resonators is good compared to competing technologies, such as lumped and distributed components, with typical YIG resonator Q greater than 4,000 at 10,000 MHz, or at a bias field of 3,571 Gauss, this Q is corresponding to a linewidth equal to 0.9 Oe.

Other novel features characteristic of the invention, as to organization and method of operation, together with further objects and advantages thereof will be better understood from the following description considered in connection with the accompanying drawing, in which preferred embodiments of the invention are illustrated by way of example. It is to be expressly understood, however, that the drawings are for illustration and description only and are not intended as a definition of the limits of the invention. The various features of novelty that characterize the invention are pointed out with particularity in the claims annexed to and forming part of this disclosure. The invention resides not in any one of these features taken alone, but rather in the particular combination of all of its structures for the functions specified.

BRIEF DESCRIPTION OF THE DRAWINGS

The invention will be better understood and its various objects and advantages will become apparent when consideration is given to the following detailed description thereof. Such description makes reference to the annexed drawings wherein.

BEST MODE FOR CARRYING OUT THE INVENTION

Figure 1:
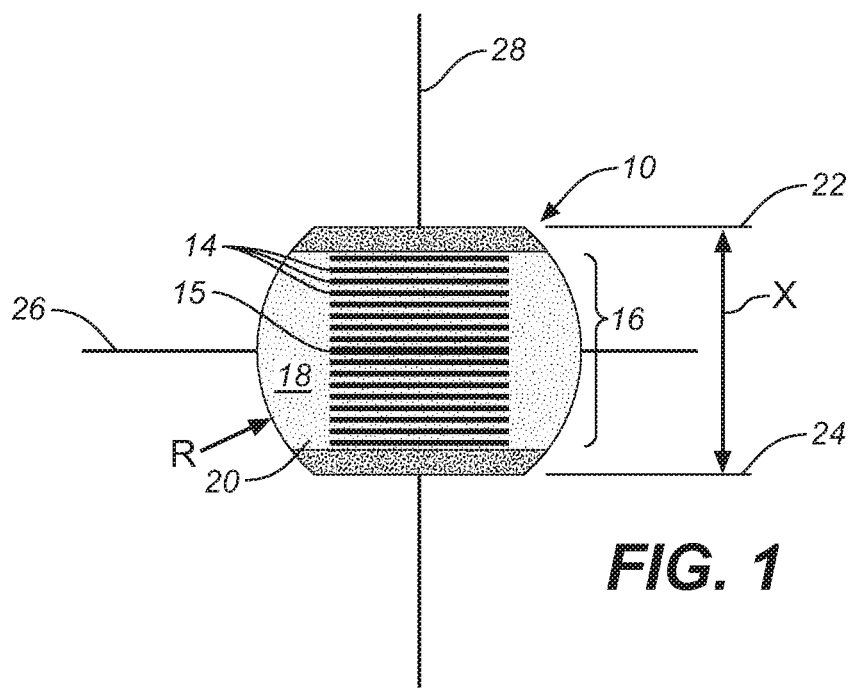
FIG. 1 is a highly schematic top plan view of a the coupling puck used in the magnetic biased high Q resonator of the present invention.

Referring to FIGS. 1 through 6, wherein like reference numerals refer to like components in the various views, there is illustrated therein a new and improved magnetic biased low loss unidirectional conductive sheet device that couples RF power to a ferrite resonator. In a preferred embodiment, the primary component is the coupling puck 10. The coupling comprises an array of parallel thin conductor strips 12 spaced apart and separated by dielectric 14 to form a very wide pattern 16 on the top side 18 of the disc body 20 that is much wider than the resonator material and long enough to eliminate end effects in relation to the resonator. The thin conductor strips extend from each side of the array into an expanded region of thin conductor material 15 disposed over a portion of the top surface 18 of the disc body. The recently developed Graphene conductors may be ideal for use as the conductor strips and expanded conductor regions.

The coupling puck 10 is configured as a planar circular disc body 18 cut along first and second parallel chords 22, 24, each equidistant from and parallel to a first centerline 26 and each bisected by a second centerline 28 perpendicular to the first centerline 26. The width dimension X and its radius of curvature R at its ends are defined by the scale of the application. This puck can be close to the resonator 30 (in this instance a single spherical YIG resonator) or at some distance depending on the response required, thus a cupped dielectric support, pin, or pedestal 32 of a variable but specific height and size is provided.

Figure 2:
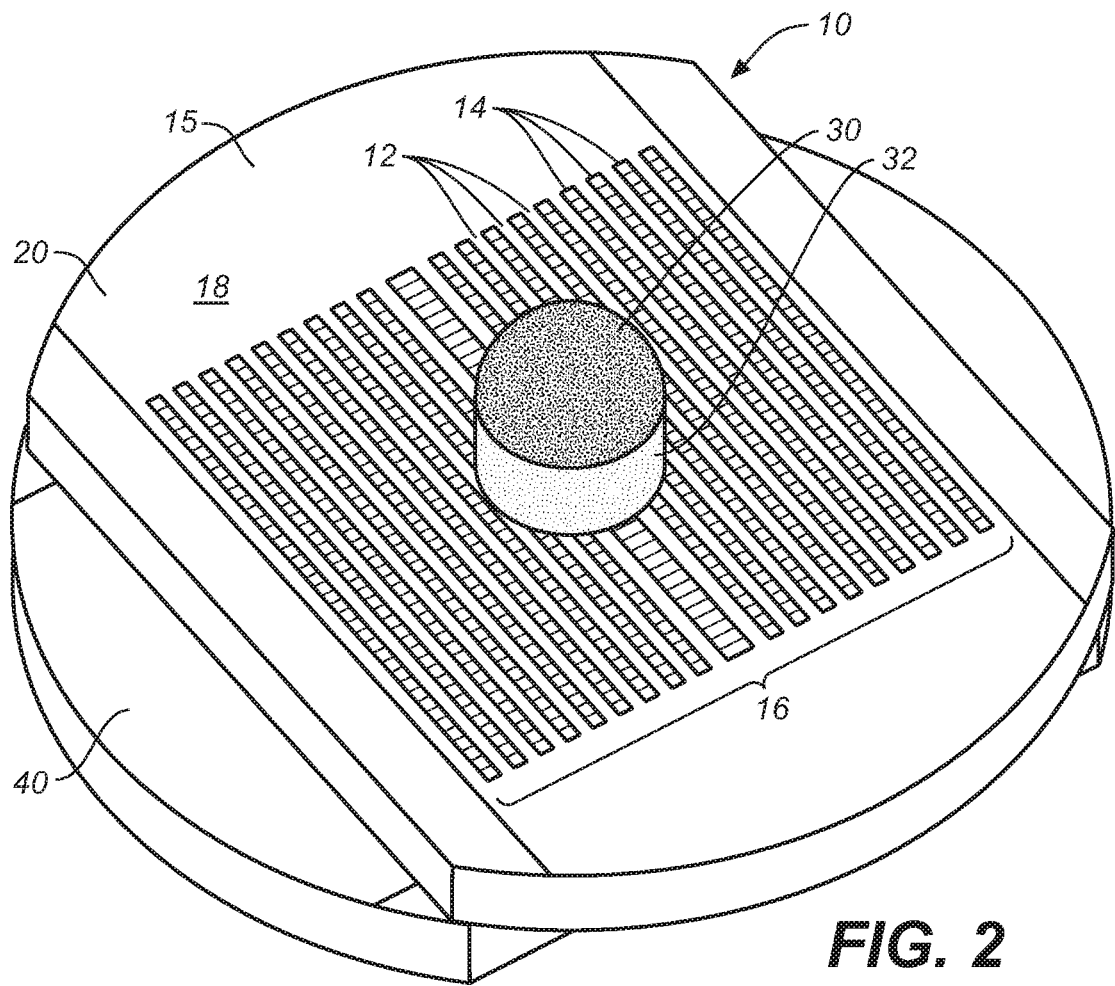
FIG. 2 is an upper perspective view showing paired coupling pucks and a ferrite resonator disposed above the upper puck.
Figure 3:
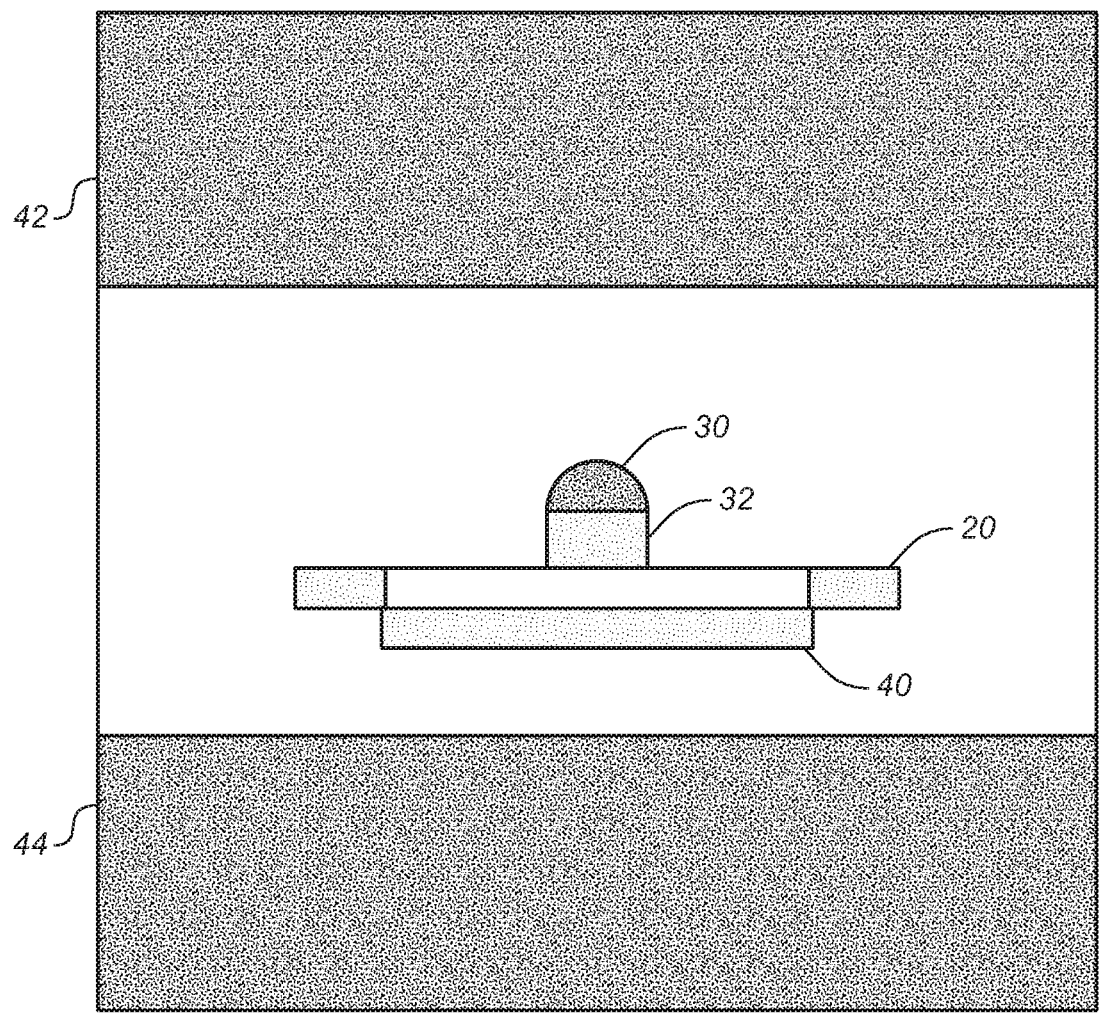
FIG. 3 is a side view in elevation thereof showing the magnetic biasing plates above and below the resonator assembly.
Figure 4:
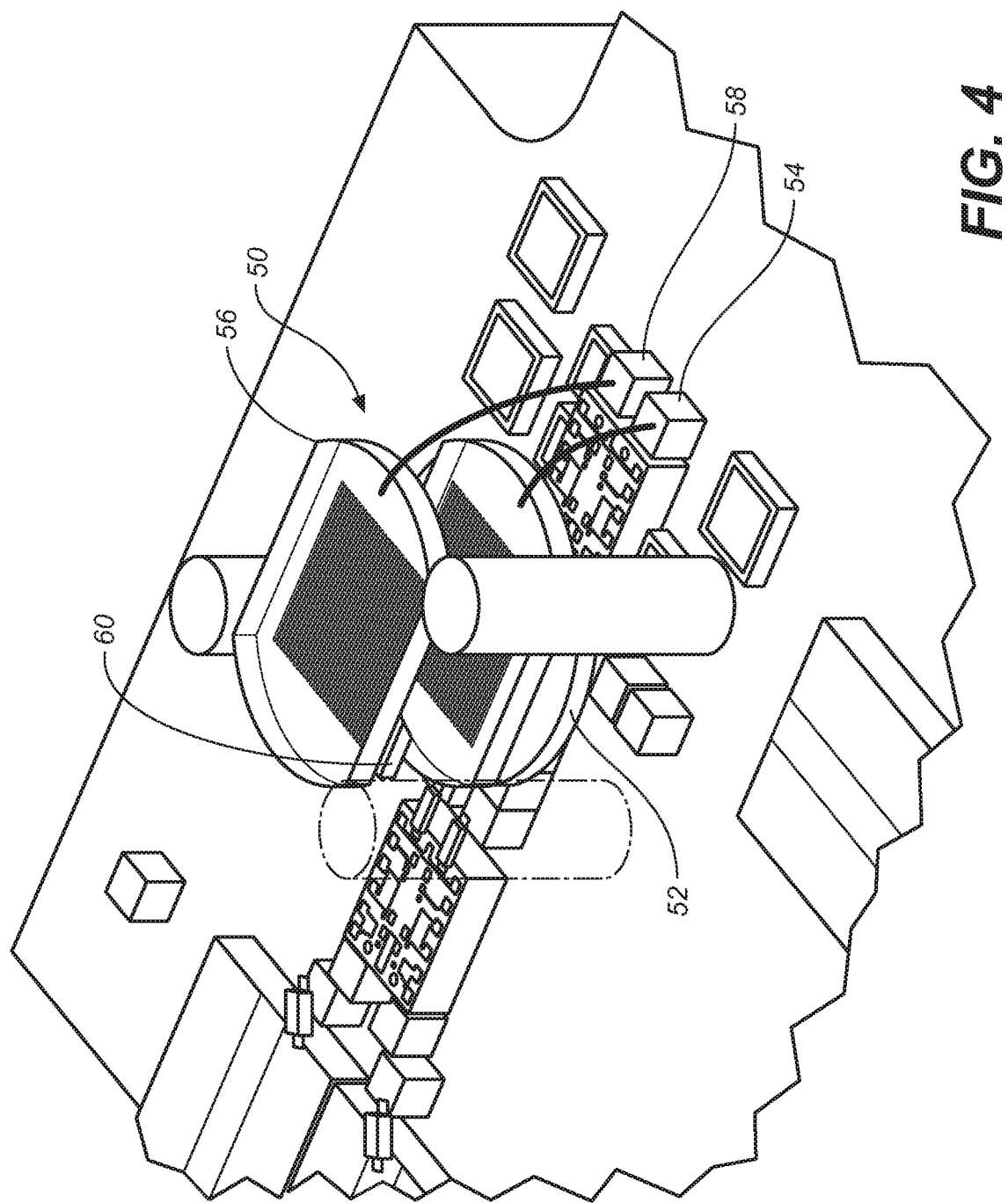
FIG. 4 is an upper perspective view showing a puck assembly incorporated into and electronically connected to differential amplifiers ICs to produce a differential oscillator when in a magnetic biasing circuit.

Units may be constructed using macro-sized coupling pucks, as shown in FIGS. 2-4. A first puck 10 is affixed such that its conductor strips 12 are at a right angle in relation to the conductor strips (not shown in FIGS. 2-3) on a second puck 40 to reduce parasitic coupling between the pucks. The pucks are disposed between first and second magnetic biasing plates 42, 44. Testing of the arrangement has demonstrated the operability of the concept with one device, and the mathematics allows extension to the nano resonators.

In an embodiment, a nanoscale YIG sphere, or a sphere formed from other similar material, is spaced such that the magnetic coupling between nano sites is optimal for coupling electromagnetic energy among the sites at a frequency determined by the magnetic field intensity. The first component considered is an oscillator to excite an array.

To better understand the functional operation, we consider first what happens in the case of thermal noise. Thermal noise sources modulate the oscillator's frequency and phase such that a mean square frequency deviation, $\Delta\omega^2$ is created. The frequency deviation modulates the carrier, and the value of the mean square frequency deviation is calculated from the expression:

$$\Delta\omega^2 = \omega 0^2 kTnB/4Qr^2 Pout \qquad (1)$$

Thermal noise dominates phase noise far from the carrier (before reaching the background noise floor). However, up-converted 1/f noise dominates phase noise at frequencies close to the carrier. The up-converted mean squared frequency deviation of a transistor oscillator is given by $$\Delta\omega^2 = [\omega_o(\partial Cd/\partial V0/2QrGr]^2 Sv0(\omega) \qquad (2)$$

Equations (1) and (2) above show that both the thermal and up-converted 1/f phase noise are dependent on $1/Q^2$. This relationship makes the Q factor of the YIG resonator a primary controlling factor in reducing phase noise and time jitter of a YIG-tuned oscillator. The loaded Q factor of a single sphere YIG resonator is between 600 and 9000, depending on geometric and materials factors. Q multiplication can take pace by placing multiple YIG spheres within the resonance of the oscillator. An array of YIG spheres (shown in FIGS. 5-6) are coupled together by adjacent sphere-to-sphere RF magnetic fields. By keeping all of the spheres within a space that is small compared to a wavelength in air, it is possible to excite all spheres in the array into a simultaneous resonance at the same frequency, which is determined by the DC magnetic field. By "locking" all of the spheres together at a single resonant frequency, it is possible to achieve an effect similar to adding sections to a large multi-section filter. Just as in the case of the multi-section filter, the additional YIG spheres sharpen the filter's response, reducing its bandwidth.

FIG. 4 shows the invention implemented as an oscillator 50 that includes a lower pair of coupling pucks 52 connected to a first differential amplifier 54, and a single upper puck 56 connected to a second differential amplifier 58, the single upper puck providing a series return for the lower puck pair such that its magnetic field adds to the total magnetic field driving a YIG sphere. The YIG sphere is not shown in this view for purposes of clarity, but in this configuration it is disposed in the region between the lower pair of coupling pucks and the upper puck. A conductive spacer 60 connects current between the lower and upper pucks so that current can flow around the YIG sphere. Other nonconductive spacers (not shown) can be provided for structural support for the pucks. It will be appreciated that combining puck layers having different phases can be employed for circuit development.

Figure 5:
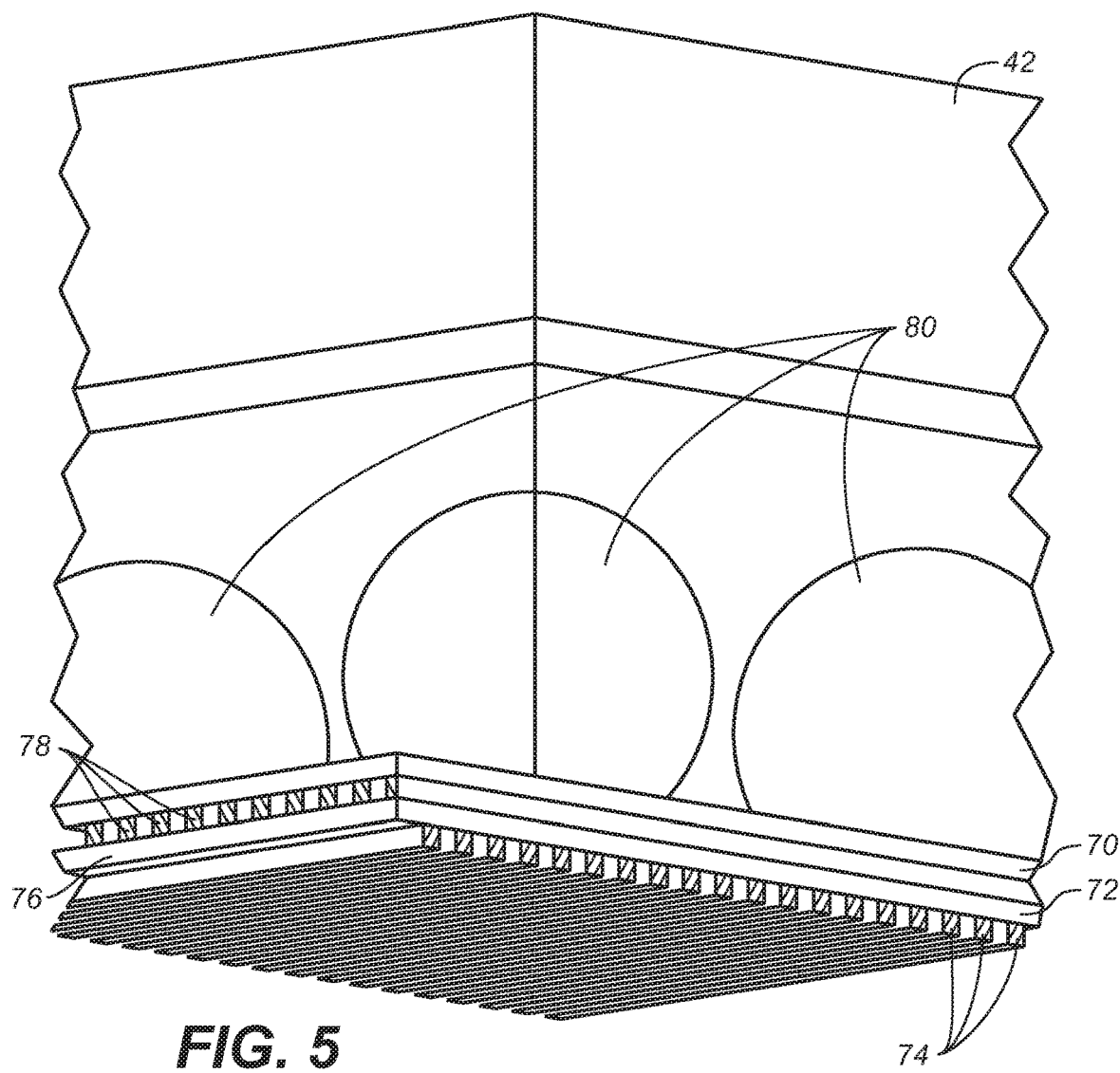
FIG. 5 is a partial detailed cross sectional view showing the layers of the paired nanoscale coupling pucks and a plurality of ferrite nano-spheres disposed atop the upper puck below a single magnetic biasing plate (the lower plate removed for clarity)

FIG. 5 is a partial detailed cross sectional view showing paired coupling pucks 70 including a first puck 72 having an array of spaced conductor strips 74 disposed on an upper side, and a second puck 76 having an array of conductor strips 78 generally normal to the conductor strips on the first puck. In this instance, however, rather than a single ferrite or YIG sphere, there are numerous spheres 80 disposed atop the upper puck so as to form an array, which might be configured along the lines of the array 82 shown in FIG. 6.

Figure 6:
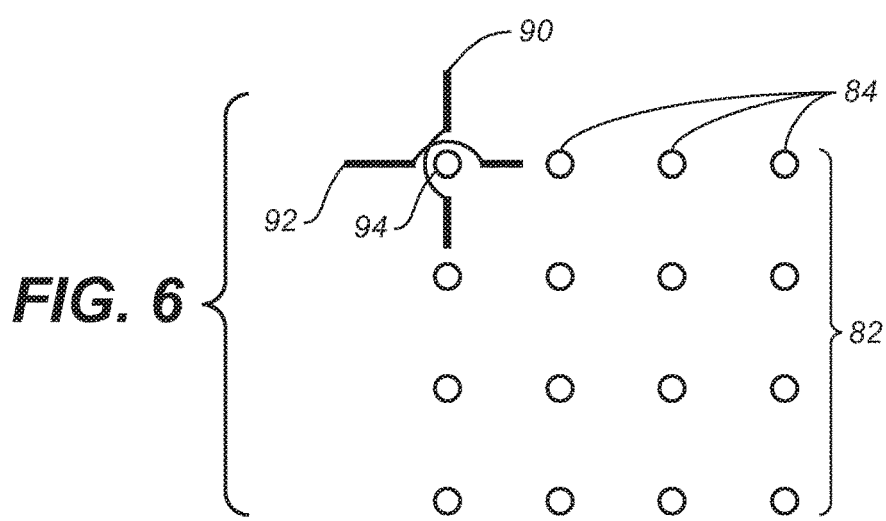
FIG. 6 is a highly schematic top plan view showing how multiple YIG nano-spheres are coupled through a matrix of AC magnetic fields to form a single quasi 2-dimensional Q multiplying YIG resonator.

FIG. 6 is a highly schematic view showing how such an array 82 of multiple YIG spheres 84 may be coupled via a matrix of AC magnetic fields to form a single Q-multiplying YIG resonator. This resonator is coupled to the rest of the circuit by a pair of coupling pucks 90, 92 that must be physically associated with only one of the YIG spheres 94. The array of spheres can be associated with a conventional integrated circuit (IC) in an adjacent layer to couple individual nano-YIGs to various functions on the IC. In this way, power to energize and the distribution of low jitter clocking cycles can be applied to a computer, DAC, ADC, memory, and higher functions utilizing both digital and analog circuits. This results in the ability to build much larger ICs and conserve power at the same time.

The overall Q of this structure is equal to the YIG filter's center frequency divided by its 3 dB bandwidth. Therefore, the addition of multiple coupled YIG spheres that reduce bandwidth will also raise Q. With 6 to 87 coupled spheres it is possible to raise the overall filter Q into the 6,000 to 15,000 range. Such an order-of-magnitude increase in Q reduces phase noise in both the thermal and 1/f regions by 20 dB, and it reduces the cycle-to-cycle time jitter by approximately a factor of 10. With this kind of improvement, it is possible to realize an overall jitter performance in the sub-1 fs range up to oscillator center frequencies of 23 GHz.

The above disclosure is sufficient to enable one of ordinary skill in the art to practice the invention, and provides the best mode of practicing the invention presently contemplated by the inventors. While there is provided herein a full and complete disclosure of the preferred embodiments of this invention, the invention is not limited to the exact construction, dimensional relationships, and operation shown and described. Various modifications, alternative constructions, changes and equivalents will occur to those skilled in the art and may be employed, as suitable, without departing from the true spirit and scope of the invention. Therefore, the above description and illustrations should not be construed as limiting the scope of the invention, which is defined by the appended claims.

What is claimed as invention is:

1. A magnetic biased low loss unidirectional conductor that couples RF power to a ferrite resonator, comprising:
    a first coupling puck having a disc body with generally planar top and bottoms sides;
    an array of spaced apart parallel conductor strips separated by dielectric and disposed on said top side of said disc body to form a wide pattern; and
    a ferrite resonator puck disposed on said top side of said first coupling puck.

2. The conductor of claim 1, wherein said array of parallel conductor strips is wider than said ferrite resonator puck and long enough to eliminate end effects in relation to said ferrite resonator.

3. The conductor of claim 2, wherein said conductor strips extend from their ends at each side of said array into an expanded region of thin conductor material disposed over a portion of the top surface of said top side of said disc body.

4. The conductor of claim 3, wherein said conductor strips and said expanded conductor regions are each fabricated from graphene.

5. The conductor of claim 1, wherein said conductor further includes a second coupling puck disposed under said first coupling puck, said second coupling puck having a disc body with generally planar top and bottoms sides and an array of spaced apart parallel conductor strips separated by dielectric and disposed on said top side of said disc body to form a wide pattern of conductor strips orthogonal to said conductor strips of said array on said first coupling puck.

6. The conductor of claim 1, wherein said ferrite resonator puck is at least one nanoscale YIG sphere.

7. The conductor of claim 6, including an array of nanoscale YIG spheres disposed on a plurality of said coupling pucks and spaced to optimize magnetic coupling between said nanoscale YIG spheres at a frequency determined by the bias magnetic field intensity.

8. The conductor of claim 1, including an array of nanoscale YIG spheres disposed on a plurality of said coupling pucks and spaced to optimize magnetic coupling between said nanoscale YIG spheres at a frequency determined by the bias magnetic field intensity.

* * * * *